(12) United States Patent
Holdgreve

(10) Patent No.: US 6,473,672 B1
(45) Date of Patent: Oct. 29, 2002

(54) APPARATUS AND METHOD FOR AUTOMATICALLY REALIGNING AN END EFFECTOR OF AN AUTOMATED EQUIPMENT TO PREVENT A CRASH

(75) Inventor: Mitch J. Holdgreve, Minster, OH (US)

(73) Assignee: Honda of America Mfg., Inc., Marysville, OH (US)

( * ) Notice: Subject to any disclaimer, the term of this patent is extended or adjusted under 35 U.S.C. 154(b) by 251 days.

(21) Appl. No.: 09/679,786

(22) Filed: Oct. 5, 2000

Related U.S. Application Data

(62) Division of application No. 09/201,571, filed on Nov. 30, 1998.

(51) Int. Cl.[7] .................................................. G06F 7/00
(52) U.S. Cl. ........................ 700/178; 700/193; 700/253; 700/255
(58) Field of Search ...................... 318/568.16; 700/255, 700/178, 186, 188, 190, 193, 192, 253, 56, 63, 64; 901/34

(56) References Cited

U.S. PATENT DOCUMENTS

| | | | | |
|---|---|---|---|---|
| 4,055,787 A | * | 10/1977 | Beadle et al. ............... | 318/569 |
| 4,638,231 A | * | 1/1987 | Monforte ................... | 294/86.4 |
| 4,816,732 A | * | 3/1989 | Wilson ................... | 318/568.21 |
| 4,821,584 A | * | 4/1989 | Lembke ...................... | 310/338 |
| 4,842,475 A | * | 6/1989 | Driels ......................... | 414/730 |
| 4,906,907 A | * | 3/1990 | Tsuchihashi et al. ... | 318/568.16 |
| 5,091,861 A | * | 2/1992 | Geller et al. ................ | 700/192 |

(List continued on next page.)

*Primary Examiner*—Leo Picard
*Assistant Examiner*—Alexander Kosowski
(74) *Attorney, Agent, or Firm*—Monica H. Choi

(57) ABSTRACT

The present invention is an apparatus and method for automatically realigning an end effector of an automated equipment after an undesired contact of the end effector to prevent a crash of the end effector. The present invention includes a plurality of contact detectors, and each of the contact detectors is disposed at a respective location with respect to the end effector. In addition, each of the contact detectors generates a respective signal for indicating direction of force on the end effector that results from the undesired contact. Furthermore, the present invention includes an end effector controller that is coupled to the plurality of contact detectors and to the end effector. The end effector controller causes the end effector to move to a reset position after the undesired contact when any of the respective signals from the plurality of contact detectors is greater than a predetermined level. The reset position includes a respective positional off-set that corresponds to the direction of the force on the end effector that results from the undesired contact as indicated by which of the respective signals is greater than the predetermined level. In one aspect of the present invention, a carrier holds the end effector and allows movement of the end effector along the direction of the force on the end effector from the undesired contact. Such movement minimizes the stress of force on the end carrier and on the part with which the end effector has made undesired contact. In that aspect of the present invention, the direction of the force on the end effector is determined from direction of the movement of the end effector during the undesired contact. By automatically realigning the end effector after an undesired contact, a crash of the end effector is prevented.

6 Claims, 7 Drawing Sheets

U.S. PATENT DOCUMENTS

| | | | | |
|---|---|---|---|---|
| 5,119,006 A | * | 6/1992 | Torii et al. | 318/568.1 |
| 5,177,563 A | * | 1/1993 | Everett et al. | 356/621 |
| 5,208,763 A | * | 5/1993 | Hong et al. | 700/192 |
| 5,214,362 A | * | 5/1993 | Torii et al. | 318/561 |
| 5,297,238 A | * | 3/1994 | Wang et al. | 700/254 |
| 5,341,459 A | * | 8/1994 | Backes | 700/260 |
| 5,360,249 A | * | 11/1994 | Monforte et al. | 294/119.1 |
| 5,440,213 A | * | 8/1995 | Arita et al. | 318/561 |
| 5,489,759 A | * | 2/1996 | Litt et al. | 219/124.34 |
| 5,619,180 A | * | 4/1997 | Massimino et al. | 340/407.1 |
| 5,917,726 A | * | 6/1999 | Pryor | 29/712 |
| 5,984,623 A | * | 11/1999 | Smith et al. | 294/104 |
| 6,002,184 A | * | 12/1999 | Delson et al. | 273/148 R |
| 6,157,873 A | * | 12/2000 | DeCamp et al. | 700/186 |
| 6,246,924 B1 | * | 6/2001 | Holdgreve | 700/190 |
| 6,298,283 B1 | * | 10/2001 | Kato et al. | 318/16 |

* cited by examiner

APPARATUS AND METHOD FOR AUTOMATICALLY REALIGNING AN END EFFECTOR OF AN AUTOMATED EQUIPMENT TO PREVENT A CRASH

This is a divisional of an earlier filed copending patent application with Ser. No. 09/201,571 filed on Nov. 30, 1998, for which priority is claimed. This earlier filed copending patent application with Ser. No. 09/201,571 is in its entirety incorporated herewith by reference.

TECHNICAL FIELD

The present invention relates to end effectors of an automated equipment used in manufacturing lines, and more particularly to a method and apparatus for automatically realigning the end effector of the automated equipment after undesired contact of the end effector, to prevent a crash of the end effector.

BACKGROUND OF THE INVENTION

The present invention will be described for a gripper, within an automated handler which palletizes and/or depalletizes parts within a manufacturing line, as an example end effector of an automated equipment used in a manufacturing line. However, as would be apparent to one of ordinary skill in the art from the description herein, the present invention may be used for any other type of automated end effectors such as cutting or grinding tools, welding guns, or other type of automated pneumatic or servo-driven parts within any type of automated equipment that requires proper alignment of the end effector.

Referring to FIG. 1, an automated handler 100 is used in a manufacturing line for assembling an article of manufacture. The automated handler 100 includes a gripper 106 which is an example of an automated end effector within an automated equipment used in a manufacturing line. The automated handler 100 includes a base 102, a movable arm 104, and the gripper 106. The position of the gripper 106 of the automated handler 100 is adjusted via the movable arm 104 such that the gripper 106 may reach down and grip a part 108 for picking up the part 108 to be incorporated in the article of manufacture.

A pallet 110 holds a plurality of parts 108, 112, and 114. Referring to FIG. 2, a top view of the pallet 110 shows a plurality of cells 202, 204, 206, 208, 210, 212, 214, 216, and 218. Typically, each of the plurality of cells holds a corresponding one of a plurality of parts. The pallet 110 is used to transfer the plurality of parts through the manufacturing line during a manufacturing process. For example, the plurality of parts may be automotive parts within an assembly line during manufacture of automotive systems.

The gripper 106 may reach down and grip a part from the pallet 110 for picking up the part to be incorporated in the article of manufacture. Alternatively, the gripper 106 may reach down to place a part into the pallet 110 to transfer parts from a manufacturing line into the pallet 110.

In either case, referring to FIG. 3, the automated handler 100 may not be properly aligned with the cells of the pallet 110. For example, some manufacturing processes heat the plurality of parts within the pallet 110 to high temperatures such as 500° C. In addition, the pallet 110 is reused for heating and cooling of a large number of parts. With such repeated heating and cooling of the pallet 110, the pallet 110 warps in shape with time such that the gripper 106 is no longer properly aligned with the cells of the pallet 110.

In any case, when the gripper 106 is not properly aligned with the cells of the pallet 110, the gripper 106 collides with a part within the pallet 110 or any other part of the pallet 100 to result in an undesirable crash. In the prior art automated handler system, the crash of the gripper 106 into a part is detected. Upon detection of the crash in the prior art, the mechanism for holding the gripper from the automated handler 100 is loosened to minimize the stress of force applied on the part and on the gripper from the crash. For example, an air chamber of the prior art holding the gripper 106 is depressurized upon detection of a crash to minimize the stress of force applied on the part and on the gripper from the crash. In addition, an operator is then notified of the crash.

Unfortunately, the automated handler 100 of the prior art is manually reset after a crash. The position of the gripper 106 is manually readjusted to be properly aligned with respect to the position of a part within the pallet 110 to be picked up. The components on the automated handler 100 of the prior art are also manually reset to begin operation of the automated handler 100 again after a crash. However, such manual resetting of the automated handler 100 after a crash results in a relatively long down-time and high labor costs during the manufacturing process.

Thus, a mechanism for preventing an undesired crash of an end effector such as the automated handler 100 is desired

SUMMARY OF THE INVENTION

Accordingly, the present invention is an apparatus and method for automatically realigning an end effector of an automated equipment after an undesired contact of the end effector to prevent a crash of the end effector.

Generally, the present invention includes a plurality of contact detectors, and each of the contact detectors are disposed at a respective location with respect to the end effector. In addition, each of the contact detectors generates a respective signal for indicating direction of force on the end effector that results from the undesired contact. Furthermore, the present invention includes an end effector controller that is coupled to the plurality of contact detectors and to the end effector. The end effector controller causes the end effector to move to a reset position after the undesired contact when any of the respective signals from the plurality of contact detectors is greater than a first predetermined level. The reset position includes a respective positional off-set that corresponds to the direction of the force on the end effector that results from the undesired contact as indicated by which of the respective signals from the plurality of contact detectors is greater than the first predetermined level.

In another aspect of the present invention, the end effector controller ignores the respective signals from the plurality of contact detectors when each of the respective signals from the plurality of contact detectors is less than the first predetermined level. Thus, the present invention allows for some light contact by the end effector within a compliancy range. Alternatively, the end effector controller shuts down any driving mechanism of the end effector and notifies an operator of the undesired contact when any of the respective signals from the plurality of contact detectors is greater than a second predetermined level that is typically significantly higher than the first predetermined level. Thus, the present invention prevents damage to the end effector and any part with which the end effector has made contact in the case of a more drastic undesired contact with higher force.

In a further aspect of the present invention, the present invention further includes a carrier for holding the end effector. The carrier allows movement of the end effector along the direction of the force on the end effector that results from the undesired contact. In that case, each of the plurality of contact detectors generates a respective signal indicating the direction of the force on the end effector from the direction of the movement of the end effector during the undesired contact.

The present invention may be used to particular advantage when the carrier includes a hinge joint between the end effector and the carrier for allowing rotational movement of the gripper along the direction of the force on the end effector that results from the undesired contact. In that case, the plurality of contact detectors may also include a plurality of pneumatic cylinders with each pneumatic cylinder being disposed on a respective location on the carrier to retract when a respective direction of the force is applied on the end effector as a result of the undesired contact.

Alternatively, the present invention may be used to particular advantage when the carrier includes a compressed air spring disposed on the end effector for movement of the end effector along the direction of the force on the end effector that results from the undesired contact by deformation of the compressed air spring. In that case, a location of deformation of the compressed air spring indicates the direction of the force on the end effector that results from the undesired contact.

In another embodiment of the present invention, each of at least one contact detector generates a respective signal for detecting the undesired contact of the end effector. The end effector controller causes the end effector to move to a first reset position after a first undesired contact of the end effector when any respective signal from the at least one contact detector is greater than a first predetermined level with the first reset position including a first predetermined positional off-set. In addition, the end effector controller causes the end effector to move to a second reset position after a second contact of the end effector when any respective signal from the at least one contact detector is greater than the first predetermined level after the end effector has been moved to the first reset position. The second reset position includes a second predetermined positional off-set that is opposite in direction from the first predetermined positional off-set and that is twice in magnitude of the first predetermined positional off-set.

In this manner, the end effector such as the automated handler 100 is automatically realigned to a reset position after an undesired contact of the end effector is detected such that a crash of the end effector is prevented. Thus, the high labor costs and large down time associated with the prior art end effectors are effectively reduced with the present invention.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, and 12 refer to elements having similar structure and function.

DETAILED DESCRIPTION

The present invention will be described for a gripper, within an automated handler which palletizes and/or depalletizes parts within a manufacturing line, as an example end effector of an automated equipment used in a manufacturing line. However, as would be apparent to one of ordinary skill in the art from the description herein, the present invention may be used for any other type of automated end effectors such as cutting or grinding tools, welding guns, or other type of automated pneumatic or servo-driven parts within any type of automated equipment that requires proper alignment of the end effector.

Figure 1:
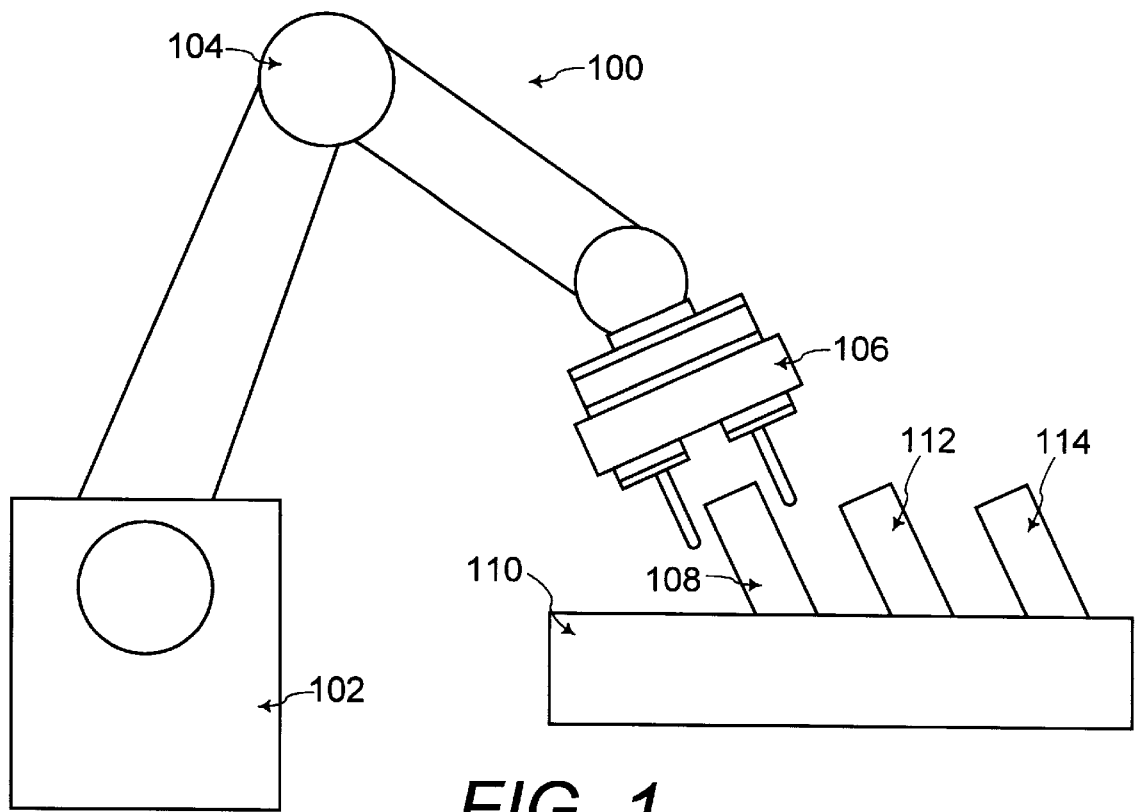
FIG. 1 shows an example automated handler during normal operation in a manufacturing line.
Figure 2:
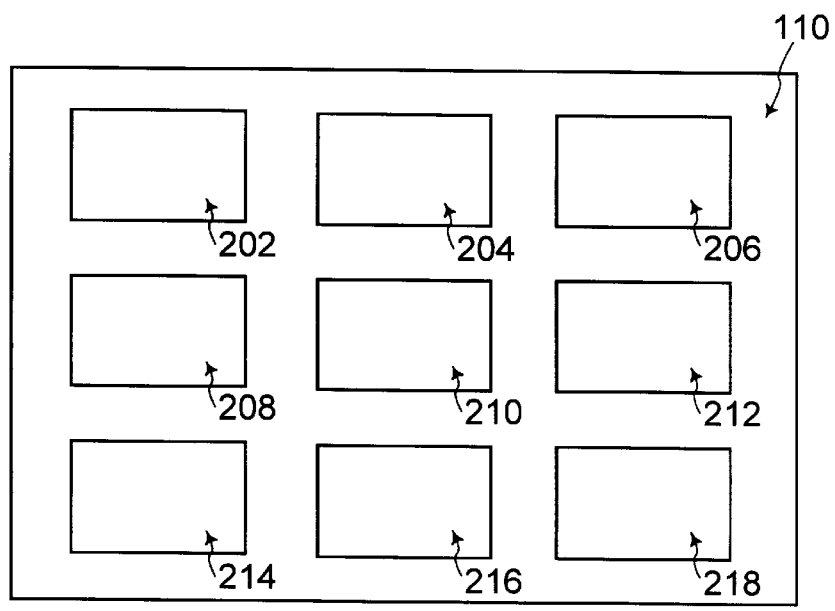
FIG. 2 shows a top view of a pallet having a plurality of cells for carrying a plurality of parts that are picked up by the automated handler of FIG. 1 within the manufacturing line.
Figure 3:
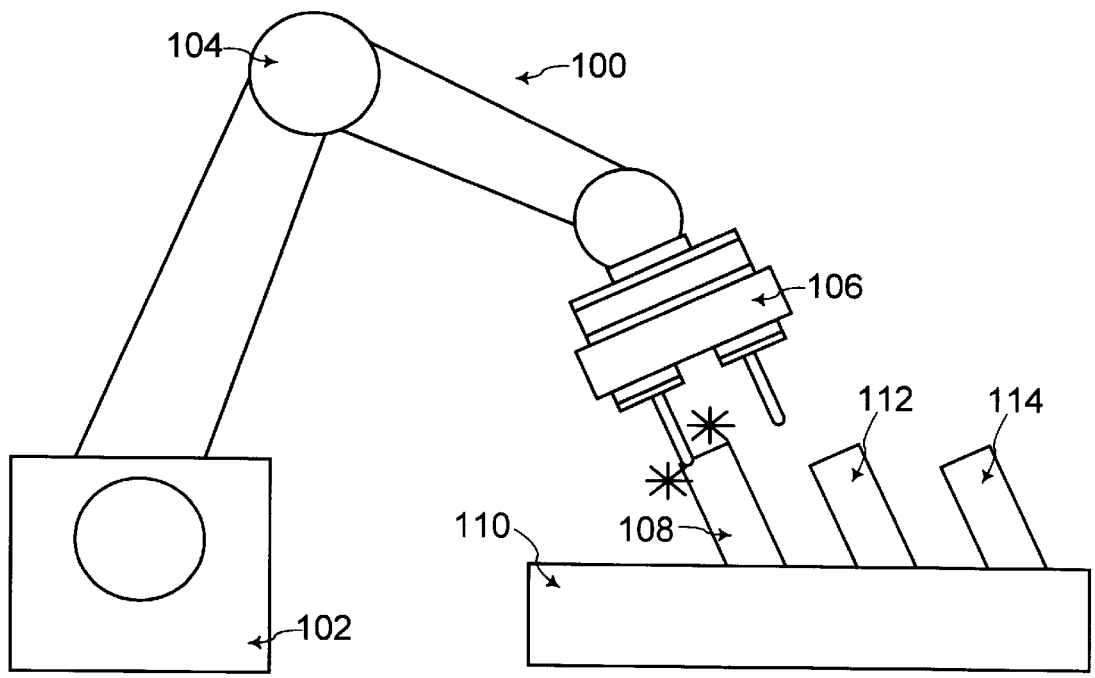
FIG. 3 shows an automated handler that has crashed into a part and that is manually reset after the crash, according to the prior art.
Figure 4:
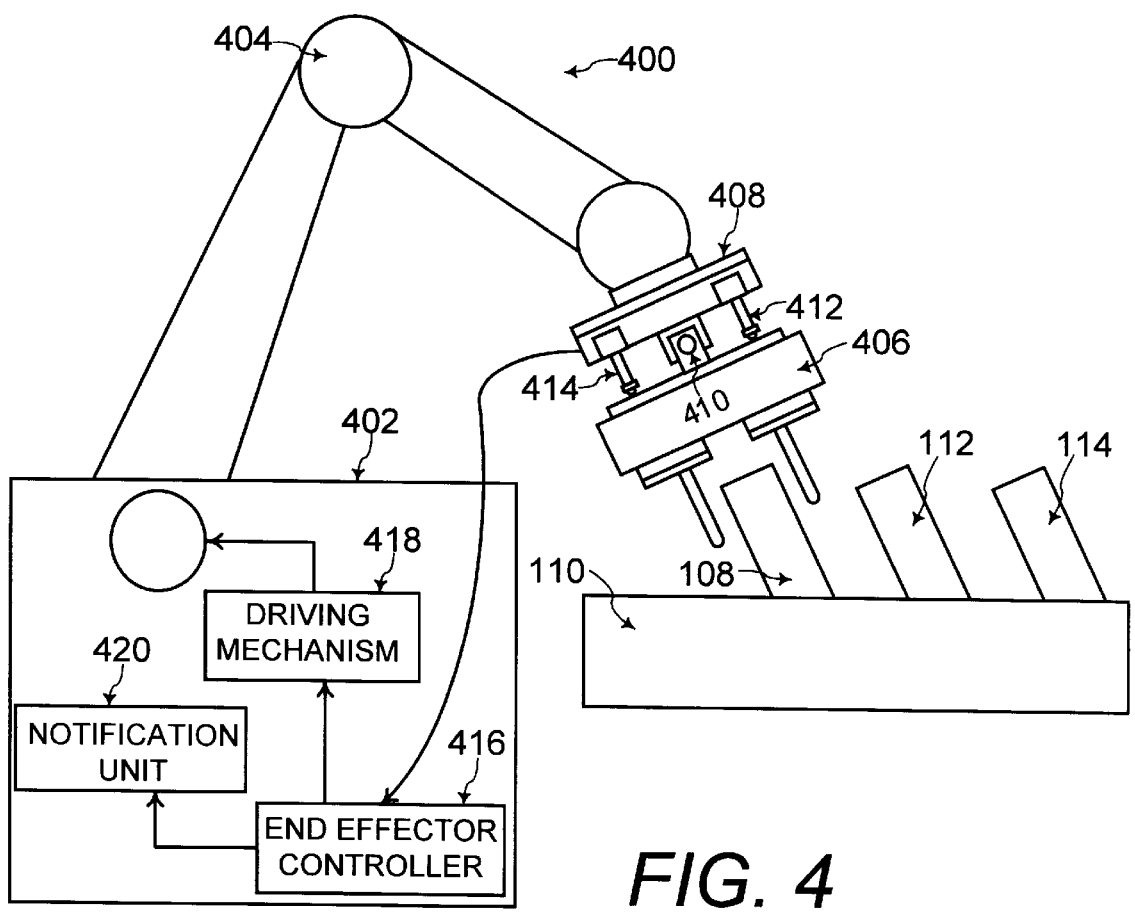
FIG. 4 shows an automated handler that includes components, such as a hinge joint, for automatically realigning the end effector after an undesired contact by determining the direction of force on the end effector that results from the contact, according to one embodiment of the present invention.

Referring to FIG. 4, an automated handler 400 of the present invention includes a mechanism for automatically realigning the automated handler 400 after an undesired contact of the automated handler 400. The automated handler 400 includes a base 402, a movable arm 404, and a gripper 406 for picking up parts from the pallet 110 or for placing parts into the pallet 110.

In addition, the present invention includes a plurality of contact detectors for determining the direction of the force on the automated handler 400 that results from the undesired contact. The plurality of contact detectors in the embodiment of the present invention of FIG. 4 are disposed on a carrier 408 which holds the gripper 406 (i.e., the end effector). In the embodiment of the present invention of FIG. 4, the carrier 408 further includes a hinge joint 410 between the end effector 406 and the carrier 408. The hinge joint 410 allows rotational movement of the end effector 406 along the direction of the force on the end effector 406 that results from the undesired contact. In addition, the plurality of contact detectors in the embodiment of the present invention of FIG. 4 includes a first pneumatic cylinder 412 and a second pneumatic cylinder 414 disposed between the end effector 406 and the carrier 408.

Figure 5:
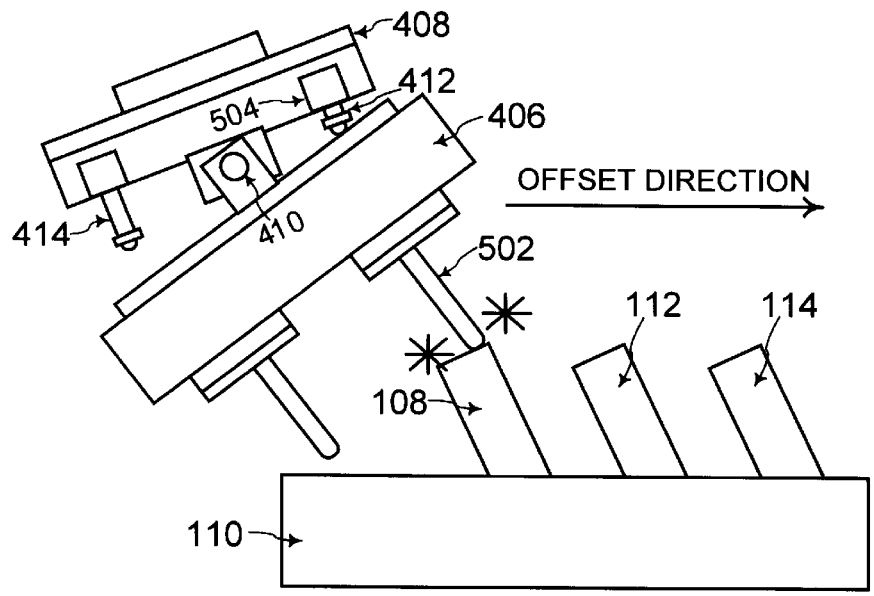
FIG. 5 illustrates operation of the components of FIG. 4 for automatically realigning the end effector after an undesired contact of the end effector with a first direction of force, according to the present invention.
Figure 6:
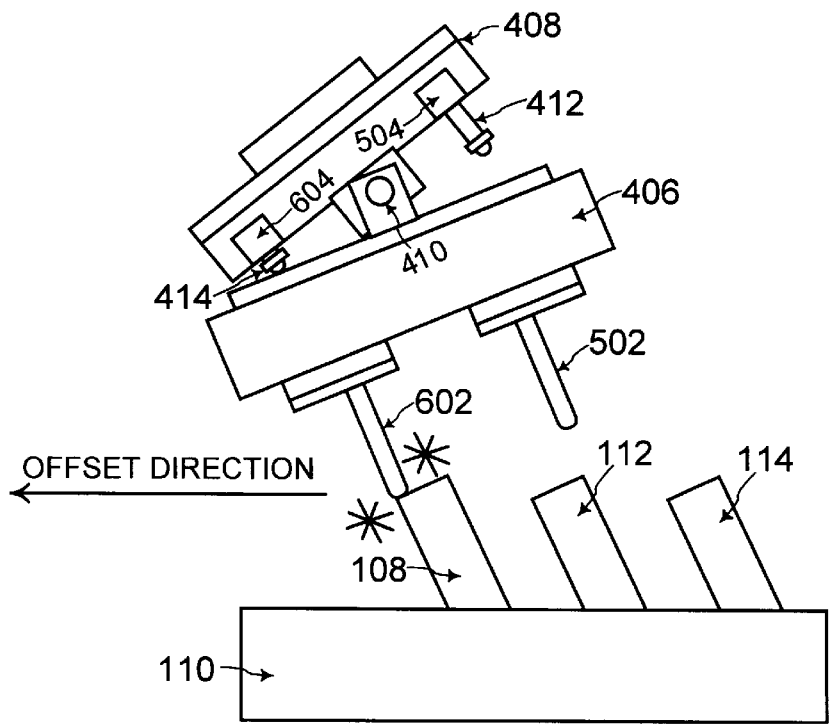
FIG. 6 illustrates operation of the components of FIG. 4 for automatically realigning the end effector after an undesired contact of the end effector with a second direction of force, according to the present invention.

FIGS. 5 and 6 illustrate the operation of the embodiment of the present invention of FIG. 4. Referring to FIG. 5, if the position of the end effector 406 is misaligned with respect to a part within the pallet 110, the end effector 406 makes an undesired contact with the part. Referring to FIG. 5, the end effector 406 is positioned insufficiently to the right direction of the first part 108 within the pallet 110 (i.e., the end effector 406 should be positioned more to the right), and a right-side jaw 502 of the gripper 406 makes an undesired contact with the first part 108. Referring to FIG. 6, the end effector 406 is positioned insufficiently to the left direction of the first part 108 within the pallet 110 (i.e., the end effector 406 should be positioned more to the left), and a left-side jaw 602 of the gripper 406 makes an undesired contact with the first part 108.

Referring to FIG. 5, when the right-side jaw 502 makes an undesired contact with the first part 108, the direction of force on the right-side jaw 502 from the contact causes the gripper 406 to move with that force by rotating counterclockwise about the hinge joint 410. Such a rotational movement of the end effector 406 pushes up on the first pneumatic cylinder 412 which is disposed toward the right-side of the end effector 406. The first pneumatic cylinder 412 retracts as the right-side of the end effector 406 pushes up the first pneumatic cylinder 412 with rotation about the hinge joint 410.

A respective signal from the first pneumatic cylinder 412 indicates the level of retraction of the first pneumatic cylinder 412. A first switch 504 coupled to the first pneumatic cylinder 412 turns on when the first pneumatic cylinder 412 retracts beyond a first predetermined level. The first switch 504 is coupled to an end effector controller 416 on the base 102 of the automated handler 400 of FIG. 4. The first switch 504 indicates to the end effector controller 416 that the right-side jaw 502 has made an undesirable contact by turning on when the first pneumatic switch 412 sufficiently retracts.

Similarly, when the left-side jaw 602 makes an undesired contact with the first part 108, the direction of force on the left-side jaw 602 from the contact causes the end effector 406 to move with that force by rotating clockwise about the hinge joint 410. Such a rotational movement of the end effector 406 pushes up on the second pneumatic cylinder 414 which is disposed toward the left-side of the end effector 406. The second pneumatic cylinder 414 retracts as the left-side of the end effector 406 pushes up the second pneumatic cylinder 414 with rotation about the hinge joint 410.

A respective signal from the second pneumatic cylinder 414 indicates the level of retraction of the second pneumatic cylinder 414. A second switch 604 coupled to the second pneumatic cylinder 414 turns on when the second pneumatic cylinder 414 retracts beyond the first predetermined level. The second switch 604 is coupled to the end effector controller 416 and indicates to the end effect controller 416 that the left-side jaw 602 has made an undesired contact by turning on when the second pneumatic switch 414 sufficiently retracts.

The end effector controller 416 upon detecting that the first switch 504 has turned on determines that the right-side jaw 502 has made the undesired contact as illustrated in FIG. 5 or upon detecting that the second switch 604 has turned on determines that the left-side jaw 602 has made the undesired contact as illustrated in FIG. 6. The end effector controller 416 determines a reset position for the end effector 406. The end effector controller 416 is coupled to a driving mechanism 418 which moves the end effector 406 of the automated handler 400 to the reset position to realign the end effector 406 after the undesired contact. The reset position includes a respective positional off-set that corresponds to the direction of the force on the automated handler from the undesired contact in order to prevent a crash of the end effector 406.

Thus, if the end effector controller 416 determines that the right-side jaw 502 has made the undesired contact because the end effector 406 is positioned insufficiently to the right direction of the first part 108 as illustrated in FIG. 5, then the end effector controller 416 includes a predetermined positional offset to the right direction. The end effector controller 416 provides this positional offset to the driving mechanism 418 which moves the end effector 406 of the automated handler 400 to a reset position having that positional offset to prevent a crash of the end effector 406.

If the end effector controller 416 determines that the left-side jaw 602 has made the undesired contact because the end effector 406 is positioned insufficiently to the left direction of the first part 108 as illustrated in FIG. 6, then the end effector controller 416 includes a predetermined positional offset to the left direction. The end effector controller 416 provides this positional offset to the driving mechanism 418 which moves the end effector 406 of the automated handler 400 to a reset position having that positional offset to prevent a crash of the end effector 406.

The end effector controller 416 may be any type of data processing unit known to one of ordinary skill in the art of electronic system design. Furthermore, the driving mechanism 418 may be any type of servo-mechanism unit for controlling the position of an end effector as known to one of ordinary skill in the art of automated machinery.

In this manner, the present invention includes a mechanism for automatically realigning an end effector such as the gripper 406 of the automated handler 400 to a reset position including a positional off-set that corresponds to the direction of force on the end effector from an undesired contact in order to prevent a crash of the end effector. The end effector is allowed to move with the direction of force on the end effector from the undesired contact. Thus, stress of force is minimized on the end effector and on the part with which the end effector has made an undesired contact.

The direction of force on the end effector from the undesired contact is determined from the respective level of retraction of each of a plurality of pneumatic cylinders. Thus, the respective signal from each of the pneumatic cylinders 412 and 414 may be input to the end effector controller 416 for indicating the direction of force on the end effector 406 from the undesired contact. Then, the positional off-set is determined depending on the direction of force on the end effector from the undesired contact.

Thus, the end effector is automatically realigned to a new position having the positional off-set such that a crash is prevented. With such an automated system of the present invention, the relatively high down-time and labor costs associated with manually resetting the automated handler 400 after a crash is minimized.

In addition, if the respective signal from each of the plurality of contact detectors, such as the pneumatic cylinders 412 and 414, is less than the first predetermined level, then the end effector controller 416 ignores the respective signals and does not move the end effector 406 to the reset position. In that case, the undesired contact of the end effector is deemed to be insignificant and within a compliancy range of allowed contact. With such insignificant contact, the end effector 406 is likely to be properly aligned with respect to a part such that the end effector 406 may still perform proper operation with respect to that part.

In the alternative, if a respective signal from any of the plurality of contact detectors is greater than a second predetermined level which is significantly higher than the first predetermined level, then a more serious undesired contact has been made by the end effector 406. In that case, the end effector controller 416 shuts down the driving mechanism 418 such that stress of force on the end effector 406 and on the part with which the end effector 406 has made undesired contact is minimized. In addition, the end effector controller 416 notifies via a notification unit 420 an operator of the manufacturing line that a serious contact of the end effector 406 has been detected. The notification unit 420 may be implemented with any types of notifiers such as sounding alarms or flashing lights, as known to one of ordinary skill in the art.

Such detection when a respective signal is greater than the second predetermined level is included as a safety precaution for the case where the present invention mistakenly fails to detect when the respective signal is greater than the first predetermined level. For example, the present invention may fail to detect when the respective signal is greater than the first predetermined level when the end effector is manually controlled such that the end effector controller 416 is not operative or in any other case where the end effector controller 416 is not operating appropriately to detect when the respective signal is greater than the first predetermined level.

Furthermore, if the end effector controller 416 determines that a predetermined number of sequential attempts to realign the end effector 406 toward a last direction of a last positional off-set are not successful, then the end effector controller 416 controls the end effector 406 to move with a new positional off-set having a new direction that is opposite to the last direction. In addition, the notification unit 420 may be used by the end effector controller 416 to notify an operator of a misalignment if the end effector controller 416 determines that a predetermined number of sequential attempts to realign the end effector 406 are not successful.

Figure 7:
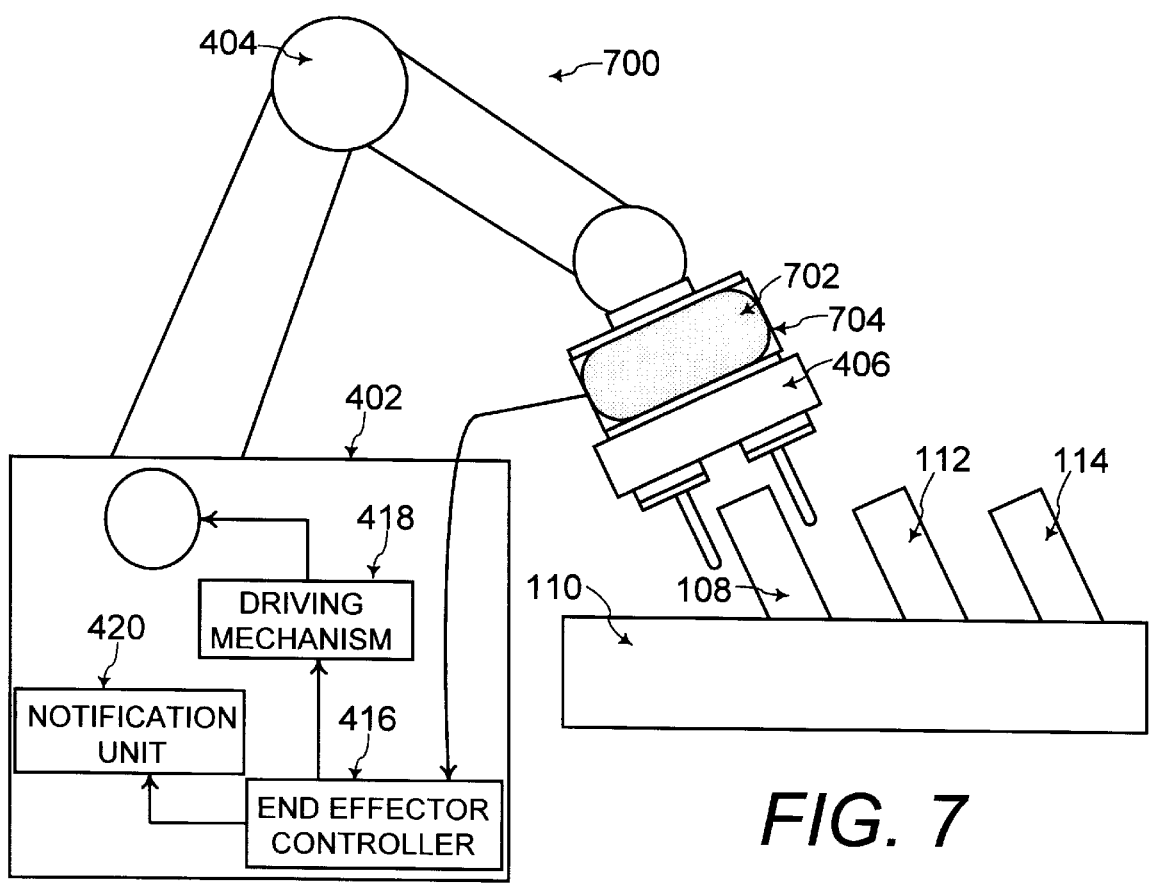
FIG. 7 shows an automated handler that includes components, such as a compressed air spring, for automatically realigning the end effector after an undesired contact by determining the direction of force on the end effector that results from the contact, according to another embodiment of the present invention.
Figure 8:
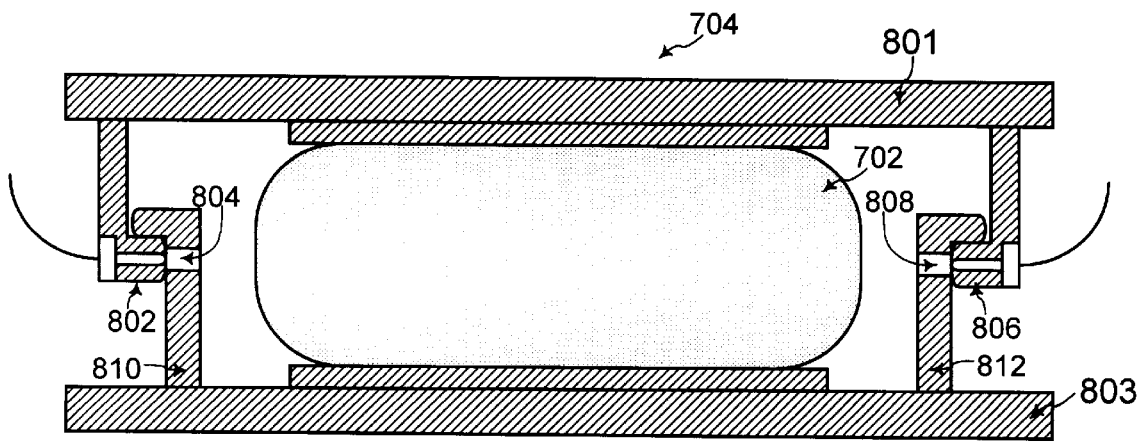
FIG. 8 shows a cross-sectional view of the components of FIG. 7 for automatically realigning the end effector after an undesired contact of the end effector including the compressed air spring.

Referring to FIG. 7, an alternative embodiment of the present invention includes an automated handler 700 having a compressed air spring 702 disposed on the end effector 406 and within a carrier 704. FIG. 8 shows a more detailed cross-section of the carrier 704 including the compressed air spring 702. The compressed air spring 702 is comprised of compressed air filled within a flexible air bag that is made from a flexible material such as rubber. Such a compressed air spring 702 is commercially available to one of ordinary skill in the art of implementing manufacturing lines.

The compressed air spring 702 is disposed between a top plate 801 and a bottom plate 803 of the carrier 704. The bottom plate 803 is coupled to the end effector 406. The plurality of contact detectors of the embodiment of FIG. 7 of the present invention includes sensors disposed around the compressed air spring 702 for detecting deformation of the compressed air spring 702. Thus, a first optical sensor 802 aligned with a first opening 804 is disposed on the left side of the compressed air spring 702, and a second optical sensor 806 aligned with a second opening 808 is disposed on the right side of the compressed air spring 702.

The first optical sensor 802 is coupled to the top plate 801, and the second optical sensor 806 is coupled to the top plate 801. The first opening 804 is disposed through a first structure 810 coupled to the bottom plate 803, and the second opening 808 is disposed through a second structure 812 coupled to the bottom plate 803.

The first optical sensor 802 generates light and detects any reflected component of such generated light. When the first optical sensor 802 is aligned with the first opening 804, the first optical sensor 802 detects only a small amount of reflected light. Similarly, the second optical sensor 806 generates light and detects any reflected component of such generated light. When the second optical sensor 806 is aligned with the second opening 808, the second optical sensor 806 detects only a small amount of reflected light.

Figure 9:
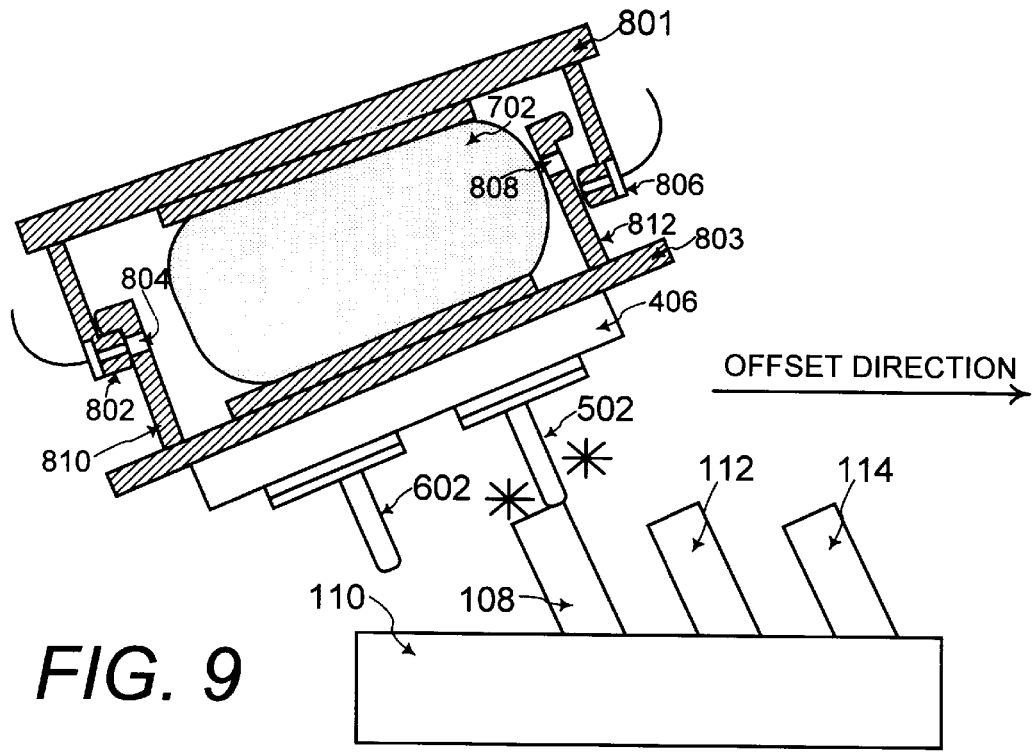
FIG. 9 illustrates operation of the components of FIG. 8 for automatically realigning the end effector after an undesired contact of the end effector with a first direction of force, according to the present invention.
Figure 10:
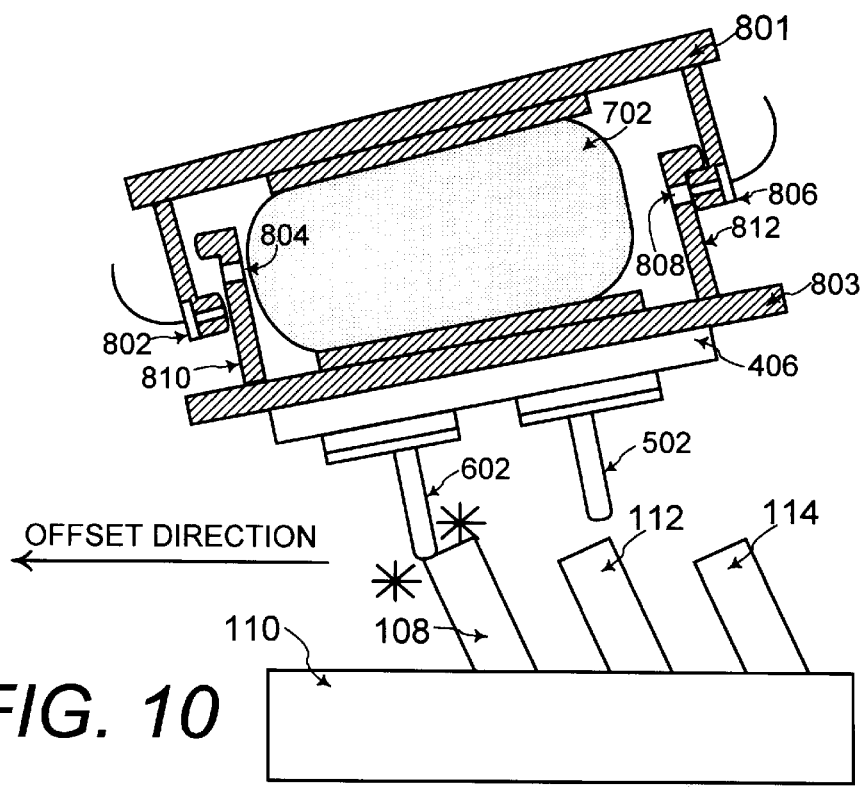
FIG. 10 illustrates operation of the components of FIG. 8 for automatically realigning the end effector after an undesired contact of the end effector with a second direction of force, according to the present invention.

FIGS. 9 and 10 illustrate the operation of the embodiment of the present invention of FIG. 7. Referring to FIG. 9, if the position of the end effector 406 (i.e., the gripper 406) is misaligned with respect to a part within the pallet 110, the end effector 406 makes an undesired contact with the part. Referring to FIG. 9, the end effector 406 is positioned insufficiently to the right direction of the first part 108 within the pallet 110 (i.e., the end effector 406 should be positioned more to the right), and the right-side jaw 502 makes an undesired contact with the first part 108. Referring to FIG. 10, the end effector 406 is positioned insufficiently to the left direction of the first part 108 within the pallet 110 (i.e., the end effector 406 should be positioned more to the left), and a left-side jaw 602 makes an undesired contact with the first part 108.

Referring to FIG. 9, when the right-side jaw 502 makes an undesired contact with the first part 108, the direction of force on the right-side jaw 502 from the undesired contact causes the end effector 406 and the bottom plate 803 of the carrier 704 to move with that force by deforming the right side of the compressed air spring 702. With the contact of the right-side jaw 502, the end effector 406 and the bottom plate 803 rotate counter-clockwise with the right side of the bottom plate 803 pushing up the right side of the compressed air spring 702. The compressed air spring 702 with such deformation acts as a cushion and absorbs the force of the contact.

In addition, with such movement of the bottom plate 803, the second structure 812 is pushed upward relative to the position of the second optical sensor 806. Thus, the second optical sensor 806 is no longer aligned with the second opening 808 within the second structure 812. The second optical sensor 806 is coupled to the end effector controller 416. Referring to FIGS. 8 and 9, when there is no undesired contact of the end effector 406, the compressed air spring 702 is not deformed and the second optical sensor 806 is aligned with the second opening 808 as shown in FIG. 8.

In that case, the second optical sensor 806 detects only a small amount of reflected light through the second opening 808 and signals to the end effector controller 416 that the right-side jaw 502 has not made an undesired contact. The second optical sensor 806 generates a respective signal indicating the amount of reflected light sensed at the second optical sensor 806. When the compressed air spring 702 is not deformed, the level of the respective signal from the second optical sensor 806 is not greater than a predetermined level.

When the right-side jaw 502 makes an undesired contact with a part within the pallet 110, the second optical sensor 806 is no longer aligned with the second opening 808 as shown in FIG. 9. Thus, the second optical sensor 806 faces the second structure 812 and senses a higher level of reflected light. In that case, the respective signal from the second optical sensor 806 is higher than the predetermined level, and the second optical sensor 806 signals to the end effector controller 416 that the right-side jaw 502 has made an undesired contact with a part within the pallet 110. (Note that when the right-side jaw 502 makes undesired contact with a part within the pallet 110, the first optical sensor 802 is still aligned with the first opening 804.)

Similarly, referring to FIG. 10, when the left-side jaw 602 makes undesired contact with the first part 108, the direction of force on the left-side jaw 602 from the contact causes the end effector 406 and the bottom plate 803 of the carrier 702 to move with that force by deforming the left side of the compressed air spring 702. With the contact of the left-side jaw 602, the end effector 406 and the bottom plate 803 rotate clockwise with the left side of the bottom plate 803 pushing up the left side of the compressed air spring 702. The compressed air spring 702 with such deformation acts as a cushion and absorbs the force of the undesired contact.

In addition, with such movement of the bottom plate 803, the first structure 810 is pushed upward relative to the position of the first optical sensor 802. Thus, the first optical sensor 802 is no longer aligned with the first opening 804 within the first structure 810. The first optical sensor 802 is coupled to the end effector controller 416.

Referring to FIGS. 8 and 10, when there is no undesired contact, the compressed air spring 702 is not deformed and the first optical sensor 806 is aligned with the first opening 804 as shown in FIG. 8. In that case, the first optical sensor 802 detects only a small amount of reflected light through the first opening 804. In that case, the respective signal from the first optical sensor 802 which indicates the amount of reflected light sensed by the first optical sensor 802 is less than the predetermined level. The end effector controller 416 in that case determines that the left-side jaw 602 has not made any undesired contact.

When the left-side jaw 602 makes undesired contact with a part within the pallet 110, the first optical sensor 802 is no longer aligned with the first opening 804 as shown in FIG. 10. Thus, the first optical sensor 802 faces the first structure 810 and detects a higher level of reflected light. When the respective signal indicating the level of reflected light sensed by the first optical sensor 802 is higher than the predetermined level, the end effector controller 416 determines that the left-side jaw 602 has made an undesired contact with a part within the pallet 110. (Note that when the left-side jaw 602 makes undesired contact with a part within the pallet 110, the second optical sensor 806 is still aligned with the first opening 808.)

With such respective signals from the first optical sensor 802 and the second optical sensor 806, the end effector controller 416 determines which one of the right-side jaw 502 and the left-side jaw 602 has made the undesired contact. Upon such detection of undesired contact by one of the right-side jaw 502 and the left-side jaw 602, the end effector controller 416 determines a reset position of the end effector 406 depending on which of the right-side jaw 502 and the left-side jaw 602 has made undesired contact. The end effector controller 416 is coupled to the driving mechanism 418 which moves the end effector 406 of the automated handler 400 to the reset position. The reset position includes a respective positional off-set that corresponds to the direction of the force on the end effector 406 from the undesired contact in order to prevent a crash of the end effector 406.

Thus, if the end effector controller 416 determines that the right-side jaw 502 has made the undesired contact because the end effector 406 is positioned insufficiently to the right direction of the first part 108 as illustrated in FIG. 9, then the end effector controller 416 includes predetermined positional offset to the right direction. The end effector controller 416 provides this positional offset to the driving mechanism 418 which moves the end effector 406 of the automated handler 400 to a reset position having that positional offset to prevent a crash of the end effector 406.

If the end effector controller 416 determines that the left-side jaw 602 has made the undesired contact because the end effector 406 is positioned insufficiently to the left direction of the first part 108 as illustrated in FIG. 10, then the end effector controller 416 includes a predetermined positional offset to the left direction. The end effector controller 416 provides this positional offset to the driving mechanism 418 which moves the end effector 406 of the automated handler 400 to a reset position having that positional offset to prevent a crash of the end effector 406.

In this manner, the present invention includes a mechanism for automatically realigning the end effector of an automated handler to a reset position including a positional off-set that corresponds to the direction of force on the end effector from the undesired contact in order to prevent a crash of the end effector. The end effector is allowed to move with the direction of force on the end effector by deformation of a compressed air spring which further acts as a cushion. Thus, stress of force is minimized on the end effector and on the part with which the end effector makes undesired contact. The direction of force on the end effector from the undesired contact is determined from the respective signal generated by the plurality of sensors disposed around the compressed air spring for determining a location of deformation of the compression air spring. Then, the positional off-set is determined depending on the direction of force on the end effector 406 from the undesired contact.

Thus, the end effector 406 is automatically realigned to a new position having the positional off-set such that a crash is prevented. With such an embodiment of FIG. 7 of the present invention, the relatively high down-time and labor costs associated with manually resetting the automated handler after a crash is minimized.

In addition, if the respective signal from each of the plurality of contact detectors, such as the optical sensors 802 and 806, is less than the predetermined level, then the end effector controller 416 ignores the respective signals and does not move the end effector 406 to the reset position. In that case, the undesired contact of the end effector is deemed to be insignificant and within a compliancy range of allowed contact. With such insignificant contact, the end effector 406 is likely to be properly aligned with respect to a part within the pallet 110 such that the end effector 406 may still perform proper operation with respect to that part.

In the alternative, if a respective signal from any of the plurality of contact detectors 802 and 806 is greater than another predetermined level which is significantly higher, then a more serious undesired contact has been made by the end effector 406. In that case, the end effector controller 416 shuts down the driving mechanism 418 such that stress of force on the end effector 406 and on the part with which the end effector 406 has made undesired contact is minimized. In addition, the end effector controller 416 notifies via the notification unit 420 an operator of the manufacturing line that a serious contact of the end effector 406 has been detected.

Furthermore, if the end effector controller 416 determines that a predetermined number of sequential attempts to realign the end effector 406 toward a last direction of a last positional off-set are not successful, then the end effector controller 416 controls the end effector 406 to move with a new positional off-set having a new direction that is opposite to the last direction. In addition, the notification unit 420 may be used to notify an operator of a misalignment if the end effector controller 416 determines that a predetermined number of sequential attempts to realign the end effector 406 are not successful.

Figure 11:
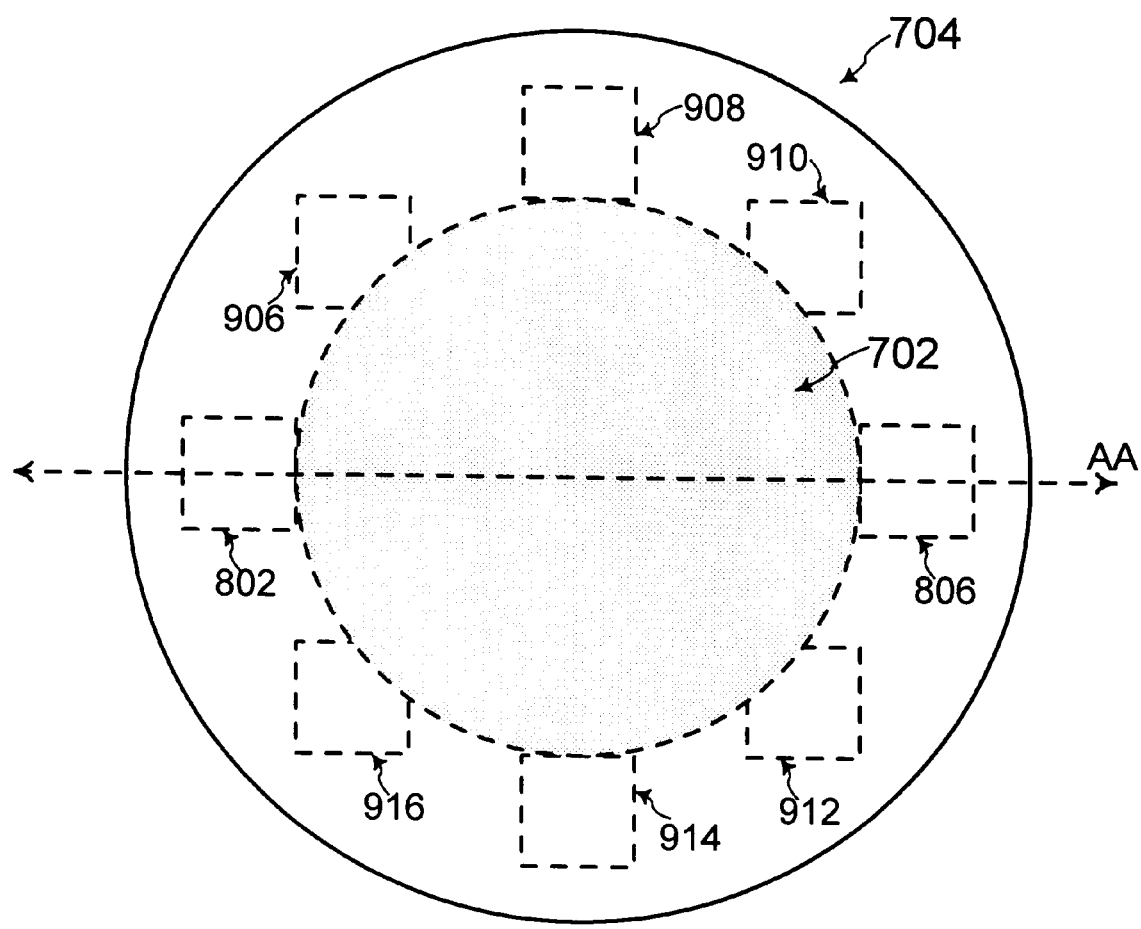
FIG. 11 shows components for detecting any of a plurality of directions of force from an undesired contact of the end effector, according to the embodiment of the present invention of FIG. 8.

The foregoing is by way of example only and is not intended to be limiting. For example, the present invention may be used with any number of sensors for detecting the direction of force of the undesired contact. For example, FIG. 11 shows a top view of the carrier 704 of FIG. 7. In addition to the first optical sensor 802 and the second optical sensor 806, the carrier 704 may further includes a third optical sensor 906, a fourth optical sensor 908, a fifth optical sensor 910, a sixth optical sensor 912, a seventh optical sensor 914, and an eighth optical sensor 916. The plurality of optical sensors are disposed around the compressed air spring 702 for determining the location of deformation of the compressed air spring 702. The cross section of FIG. 8 is taken along the line AA in FIG. 11, and each of the plurality of optical sensors 906, 908, 910, 912, 914, and 916 operates in similar manner as described for the first optical sensor 802 and the second optical sensor 806 when the compressed air spring 702 deforms at a respective location that is near a corresponding optical sensor.

Figure 12:
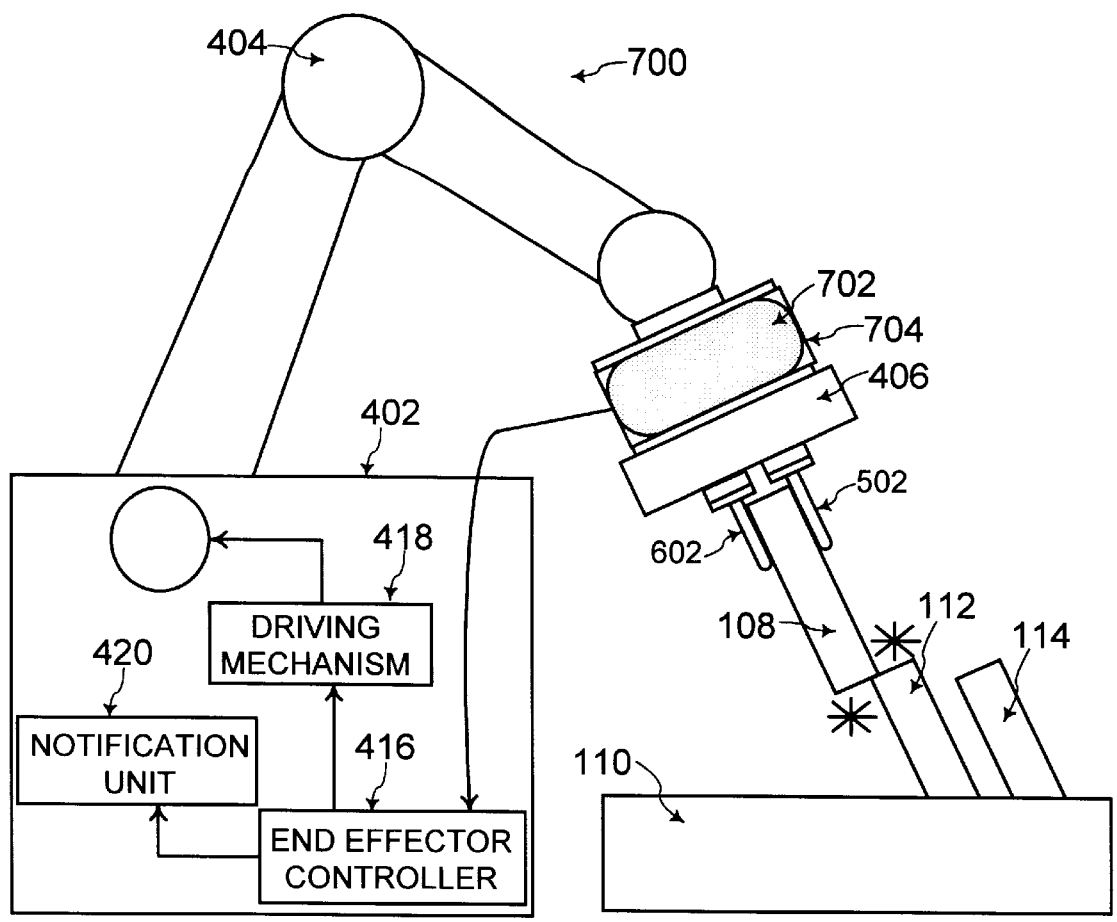
FIG. 12 shows components for automatically realigning the end effector after an undesired contact of the end effector when the direction of force on the end effector that results from an undesired contact is difficult to determine, according to another embodiment of the present invention.

Referring to FIG. 12, in another embodiment of the present invention, the automated handler 700 of FIG. 7 is used to palletize parts into the pallet 110. In that case, the right-side jaw 502 and the left-side jaw 602 are closed around the first part 108 to hold and place the first part 108 into the pallet 110. The first part 108 may make an undesired contact with a part within the pallet 110 as shown in FIG. 12. In that case, the direction of force on the end effector 406 from the undesired contact may be difficult to determine from the respective signals generated at the plurality of contact detectors because of the narrow width of the first part 108.

In that case, when any of the respective signals generated by the plurality of contact detectors (or by at least one contact detector) is greater than a predetermined level, then the end effector controller 416 controls the end effector 406 to move to a first reset position after a first undesired contact of the end effector. When any respective signal from the at least one contact detector is greater than the predetermined level, the first reset position includes a first predetermined positional off-set having a first direction and magnitude. Subsequently, if a second undesired contact is not detected after this realignment to the first reset position, the end effector 406 has been correctly realigned.

On the other hand, if a second undesired contact is subsequently detected when any respective signal from the at least one contact detector is greater than the first predetermined level after the end effector has been moved to the first reset position, the end effector 406 was not correctly realigned. Thus, in that case, the end effector controller controls the end effector 406 to move to a second reset position with a second predetermined positional off-set that is opposite in direction from the first predetermined positional off-set and that is twice in magnitude of the first predetermined positional off-set. In addition, the notification unit 420 may be used by the end effector controller 416 to notify an operator of a misalignment if the end effector controller 416 determines that a predetermined number of sequential attempts to realign the end effector 406 are not successful.

In this manner, the present invention attempts to properly align the end effector 406 to prevent a crash even when the direction of force on the end effector from an undesired contact is difficult to determine. Such an aspect of the present invention is particularly advantageous when the end effector is small or narrow or is carrying a part that is small or narrow such that the direction of force on the end effector from an undesired contact is difficult to determine.

The foregoing is by way of example only and is not intended to be limiting. The present invention was described for a gripper, within an automated handler which palletizes and/or depalletizes parts within a manufacturing line, as an example end effector of an automated equipment used in a manufacturing line. However, as would be apparent to one of ordinary skill in the art from the description herein, the present invention may be used for any other type of automated end effectors such as cutting or grinding tools, welding guns, or other type of automated pneumatic or servo-driven parts within any type of automated equipment that requires proper alignment of the end effector.

The present invention is limited only as defined in the following claims and equivalents thereof.

I claim:

1. An apparatus for automatically realigning an end effector of an automated equipment after an undesired contact of said end effector to prevent a crash of said end effector, the apparatus comprising:

at least one contact detector, each contact detector generating a respective signal for detecting said contact of said end effector; and an end effector controller, coupled to said at least one contact detector and to said end effector, for controlling said end effector to move to a first reset position after a first contact of said end effector when any said respective signal from said at least one contact detector is greater than a first predetermined level, said first reset position including a first predetermined positional off-set, and wherein said end effector controller controls said end effector to move to a second reset position after a second contact of said end effector when any said respective signal from said at least one contact detector is greater than said first predetermined level after said end effector has been moved to said first reset position, said second reset position including a second predetermined positional off-set that is opposite in direction from said first predetermined positional off-set and that is twice in magnitude of said first predetermined positional off-set.

2. The apparatus of claim 1, wherein said end effector controller notifies an operator of misalignment of said end effector if subsequent contact of said end effector is detected by said plurality of contact detectors after a predetermined number of sequential attempts to realign said end effector.

3. The apparatus of claim 1, further comprising:

a carrier for holding said end effector, said carrier including a compressed air spring disposed on said end effector for allowing movement of said end effector by deformation of said compressed air spring along a direction of force on said end effector that results from said first contact and said second contact; and a plurality of sensors disposed around said compressed air spring for detecting the location of deformation of said compressed air spring, each of said plurality of sensors being disposed at a respective location around said compressed air spring and generating a respective signal for indicating the level of deformation of said compressed air spring near said respective location on said compressed air spring.

4. A method for automatically realigning an end effector of an automated equipment after an undesired contact of said end effector to prevent a crash of said end effector, the method including the steps of:

detecting said contact of said end effector by analyzing a respective signal generated by at least one contact detector;

controlling said end effector to move to a first reset position after a first contact of said end effector when any said respective signal from said at least one contact detector is greater than a first predetermined level, said first reset position including a first predetermined positional off-set; and controlling said end effector to move to a second reset position after a second contact of said end effector when any said respective signal from said at least one contact detector is greater than said first predetermined level after said end effector has been moved to said first reset position, said second reset position including a second predetermined positional off-set that is opposite in direction from said first predetermined positional off-set and that is twice in magnitude of said first predetermined positional off-set.

5. The method of claim 4, further including a step of notifying an operator of misalignment of said end effector if subsequent contact of said end effector is detected by said plurality of contact detectors after a predetermined number of sequential attempts to realign said end effector.

6. The method of claim 4, further including steps of:

allowing movement of said end effector by deformation of a compressed air spring along a direction of force on said end effector that results from said first contact and said second contact of said end effector; and generating a respective signal at each of a plurality of sensors disposed around said compressed air spring for indicating the level of deformation of said compressed air spring near a respective location on said compressed air spring.

* * * * *